US012727508B2

(12) United States Patent
Li et al.

(10) Patent No.: US 12,727,508 B2
(45) Date of Patent: Sep. 1, 2026

(54) LIGHT EMITTING BASEPLATES AND METHODS OF MANUFACTURING THE SAME, AND DISPLAY DEVICES

(71) Applicant: BOE Technology Group Co., Ltd., Beijing (CN)

(72) Inventors: Haixu Li, Beijing (CN); Zhanfeng Cao, Beijing (CN); Ke Wang, Beijing (CN); Yan Qu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 914 days.

(21) Appl. No.: 17/921,326

(22) PCT Filed: Nov. 29, 2021

(86) PCT No.: PCT/CN2021/134120
§ 371 (c)(1),
(2) Date: Oct. 25, 2022

(87) PCT Pub. No.: WO2023/092594
PCT Pub. Date: Jun. 1, 2023

(65) Prior Publication Data
US 2024/0222336 A1 Jul. 4, 2024

(51) Int. Cl.
*H10W 90/00* (2026.01)
*H10H 20/01* (2025.01)
*H10H 20/819* (2025.01)

(52) U.S. Cl.
CPC ............ *H10W 90/00* (2026.01); *H10H 20/01* (2025.01); *H10H 20/819* (2025.01)

(58) Field of Classification Search
CPC .. H10H 20/819; H10H 20/01; H01L 25/0753; H10W 90/00
(Continued)

(56) References Cited

U.S. PATENT DOCUMENTS 9,082,931 B2 * 7/2015 Katsuno ............... H10H 20/819
9,831,387 B2 * 11/2017 Chu ..................... H10H 29/142
(Continued)

FOREIGN PATENT DOCUMENTS

CN 109166826 A 1/2019
CN 112133795 A 12/2020
(Continued)

OTHER PUBLICATIONS

PCT/CN2021/134120 international search report.
CN2021800036656 first office action dated Apr. 28, 2026.

*Primary Examiner* — Igwe U Anya
(74) *Attorney, Agent, or Firm* — IPro, PLLC

(57) ABSTRACT

A light emitting baseplate and a method of manufacturing the same, and a display device. The light emitting baseplate includes a substrate, and a plurality of light emitting units and a plurality of supporting columns located on the substrate. The plurality of supporting columns are located on surfaces of the light emitting units away from the substrate. A surface of each of the light emitting units away from the substrate is provided with the supporting columns respectively. Heights of the supporting columns are equal. The supporting columns disposed on a surface of a same light emitting unit are symmetrically distributed about a symmetrical axis of the surface. The display device includes the light emitting baseplate.

20 Claims, 4 Drawing Sheets

(58) Field of Classification Search
USPC ........................................................... 257/79
See application file for complete search history.

(56) References Cited

U.S. PATENT DOCUMENTS

| | | | | |
|---|---|---|---|---|
| 2015/0362165 | A1* | 12/2015 | Chu | H10H 20/825 362/235 |
| 2017/0092820 | A1* | 3/2017 | Kim | H10H 20/825 |
| 2017/0200873 | A1 | 7/2017 | Nakabayashi | |
| 2020/0027865 | A1* | 1/2020 | Fan | H10H 29/142 |
| 2020/0266177 | A1* | 8/2020 | Hsieh | H10H 29/142 |
| 2020/0403114 | A1* | 12/2020 | Meng | H01L 25/0753 |
| 2021/0249388 | A1 | 8/2021 | Xu | |

FOREIGN PATENT DOCUMENTS

| | | | |
|---|---|---|---|
| CN | 112820673 | A | 5/2021 |
| CN | 113330549 | A | 8/2021 |
| CN | 113451346 | A | 9/2021 |
| CN | 113497011 | A | 10/2021 |
| CN | 113707597 | A | 11/2021 |

* cited by examiner

LIGHT EMITTING BASEPLATES AND METHODS OF MANUFACTURING THE SAME, AND DISPLAY DEVICES

CROSS-REFERENCE TO RELATED APPLICATIONS

The present application is a US national phase of PCT application No. PCT/CN2021/134120, filed on Nov. 29, 2021, the entire contents of which is incorporated herein by reference for all purposes.

TECHNICAL FIELD

The present application relates to field of display technologies, and in particular to light emitting baseplates and methods of manufacturing the same, and display devices.

BACKGROUND

Mini-LED is a new LED display technology derived from small pitch LED, also known as sub-millimeter Light Emitting Diode. A chip size of the Mini-LED approximately ranges from 50 μm to 300 μm, which is between chip sizes of conventional LED and Micro LED. Since the Mini-LED has a relatively good display effect as well as a thin and light experience and advantages such as relatively high contrast ratio and long service life, a trend of using the Mini-LED in the display field is obvious.

SUMMARY

According to a first aspect of embodiments of the present application, there is provided a light emitting baseplate. The light emitting baseplate includes:

- a substrate;
- a plurality of light emitting units located on the substrate;
- a plurality of supporting columns located on surfaces of the light emitting units away from the substrate; wherein a surface of each light emitting unit of the light emitting units away from the substrate is provided with the supporting columns, respectively, heights of the supporting columns are equal; and the supporting columns disposed on the surface of the light emitting unit are symmetrically distributed about a symmetrical axis of the surface.

In an embodiment, a minimum distance between a supporting column and an edge of a light emitting unit is greater than 3 μm.

In an embodiment, the surface of the light emitting unit away from the substrate is rectangular, and one supporting column is disposed at each of four corners of the surface of the light emitting unit away from the substrate, respectively.

In an embodiment, the surface of the light emitting unit away from the substrate is rectangular, one supporting column with a long strip shape is disposed near each of two opposite sides of the surface of the light emitting unit away from the substrate, respectively, and the supporting columns disposed near the two opposite sides of the surface are symmetrical.

In an embodiment, a distance from the supporting column disposed near a short side of the surface of the light emitting unit away from the substrate to a center of the surface is greater than or equal to one-third of a length of a long side of the surface, or a distance from the supporting column disposed near the long side of the surface of the light emitting unit away from the substrate to the center of the surface is greater than or equal to one-third of a length of the short side of the surface.

In an embodiment, a first inclined plane is disposed on a side of each of the supporting columns away from the substrate, a maximum emergence angle of light rays emitted by the light emitting units incident through the supporting columns to a medium between adjacent supporting columns is a first included angle, an included angle between the first inclined plane and the substrate is a second included angle, and the second included angle is greater than or equal to the first included angle.

In an embodiment, the light emitting baseplate further includes adhesive layers located on a side of the light emitting units away from the substrate; a surface of the substrate comprises one or more first target regions; and heights of the adhesive layers gradually increase from a center to an edge of the first target region.

In an embodiment, the one or more first target regions each comprises a first central region and a plurality of first circumferential regions located around the first central region, distances between surfaces of the adhesive layers away from the substrate that are disposed in a same first circumferential region and the substrate are equal; in two adjacent first circumferential regions, the distances between surfaces of the adhesive layers away from the substrate that are disposed in an outer first circumferential region and the substrate are greater than the distances between surfaces of the adhesive layers 40 away from the substrate that are disposed in an inner first circumferential region and the substrate.

In an embodiment, height difference between the adhesive layers in any two adjacent first circumferential regions is equal.

In an embodiment, a second inclined plane is disposed on a side of each of the adhesive layers away from the substrate, a maximum emergence angle of light rays emitted by the light emitting units and incident through the adhesive layers to a medium between adjacent adhesive layers is a third included angle, an included angle between the second inclined plane and the surface of the substrate facing the adhesive layers is a fourth included angle, and the fourth included angle is greater than or equal to the third included angle.

According to a second aspect of embodiments of the present application, there is provided a method for manufacturing a light emitting baseplate, including:

- providing a transfer baseplate comprising a baseplate body, a plurality of dissociation layers disposed on a side of the baseplate body, and respective adhesive layers disposed on a side of the dissociation layers away from the baseplate body;
- disposing respective light emitting units on a side of the adhesive layers away from the baseplate body; wherein supporting columns are respectively disposed on a surface of each of the light emitting units facing the baseplate body, and each of the supporting columns is respectively pressed on the baseplate body; the supporting columns disposed on a surface of a same light emitting unit are symmetrically distributed about a symmetrical axis of the surface;
- providing a substrate facing surfaces of the light emitting units away from the baseplate body;
- irradiating a side of the transfer baseplate away from the substrate by a laser which passes through the baseplate body and acts on the dissociation layers to dissociate the dissociation layers, so that the light emitting units and the adhesive layers are separated from the transfer baseplate and transferred to the substrate.

In an embodiment, a surface of the baseplate body comprises one or more second target regions, the one or more second target regions each are provided with more than one of the dissociation layers; the transfer baseplate is further provided with bumps between the baseplate body and the dissociation layers; heights of the bumps gradually decrease from a center to an edge of the second target region.

In an embodiment, the one or more second target regions each comprise a second central region and a plurality of second circumferential regions located around the second central region, the heights of the bumps disposed in a same second circumferential region are equal; the heights of the bumps in an outer second circumferential region is greater than the heights of the bumps in an inner second circumferential region in two adjacent second circumferential regions.

In an embodiment, irradiating the side of the transfer baseplate away from the substrate by a laser, including:

irradiating the side of the transfer baseplate away from the substrate by a laser that has passed through a field lens; wherein an area of the field lens is substantially equal to a size of the second target region.

In an embodiment, when irradiating the side of the transfer baseplate away from the substrate by the laser, an edge of an orthographic projection of each of the dissociation layers on the baseplate body is located within an edge of an orthographic projection of a light spot of the laser on the baseplate body.

In an embodiment, distances between surfaces of the adhesive layers away from the baseplate body and the baseplate body are equal.

In an embodiment, a shape of a cross section of each of the dissociation layers is an axisymmetric figure or a centrosymmetric figure.

In an embodiment, prior to disposing the respective light emitting units on the side of the adhesive layers away from the baseplate body, difference between a height of the supporting columns and a distance from surfaces of the adhesive layers away from the baseplate body to the baseplate body ranges from 0.5 μm to 1.5 μm;

after disposing the respective light emitting units on the side of the adhesive layers away from the baseplate body, the supporting columns are compressed, and surfaces of the supporting columns away from the light emitting units are pressed on the baseplate body.

In an embodiment, a thickness of each of the dissociation layers is less than 1 mm.

According to a third aspect of the embodiments of the present application, there is provided a display device including the light emitting baseplate described above.

In the light emitting baseplates and methods of manufacturing the same and display devices provided by the embodiments of the present application, because the supporting columns are disposed on the surfaces of the light emitting units facing the baseplate body, during a manufacturing process of the light emitting baseplate, the supporting columns are pressed on the baseplate body after the light emitting units are disposed on the adhesive layers, the supporting columns can support the light emitting units. Since the supporting columns disposed on a surface of a same light emitting unit are symmetrically distributed on the surface of the light emitting unit facing the baseplate body, supporting force of the supporting columns on the light emitting unit is relatively evenly distributed, which can avoid tilting or shift of the light emitting unit relative to the dissociation layer due to uneven force after the light emitting unit is adhered to the transfer baseplate by the adhesive layer, thus avoiding deviation of a position of the light emitting unit relative to a predetermined bonding position due to the tilting or shift of the light emitting unit relative to the dissociation layer after the light emitting unit is transferred to the substrate, which may improve a transfer yield of the light emitting units and a yield of the light emitting baseplate.

DETAILED DESCRIPTION OF THE EMBODIMENTS

Examples of embodiments will be described in detail here, examples of which are illustrated in the accompanying drawings. When the following description relates to the accompanying drawings, unless specified otherwise, the same numerals in different drawings represent the same or similar elements. The examples described in the following examples do not represent all examples consistent with the present application. On the contrary, the implementations are merely examples of apparatuses and methods that are described in detail in the appended claims and that are consistent with some aspects of this application.

The terms used in this application are merely for the purpose of describing specific embodiments, and are not intended to limit this application. The terms "a", "said" and "the" of singular forms used in this application and the appended claims are also intended to include plural forms, unless otherwise specified in the context clearly. It should also be understood that the term "and/or" used herein includes any and all possible combinations of one or more of the associated listed items.

It should be understood that although the terms such as first, second, and third may be used herein to describe various information, such information should not be limited to these terms. These terms are used to distinguish one category of information from another. For example, within the scope of this application, first information may also be referred to as second information, and similarly, second information may also be referred to as first information. Depending on the context, the word "if" as used herein may be interpreted as "when" or "upon" or "in response to determining".

Embodiments of the present application provide light emitting baseplates and methods of manufacturing the same, and display devices. The light emitting baseplates and methods of manufacturing the same, and the display devices in the embodiments of the present application are described in detail below with reference to the accompanying drawings. The features of the embodiments described below may be complementary to or combined with each other in case of no conflict.

Figure 1:
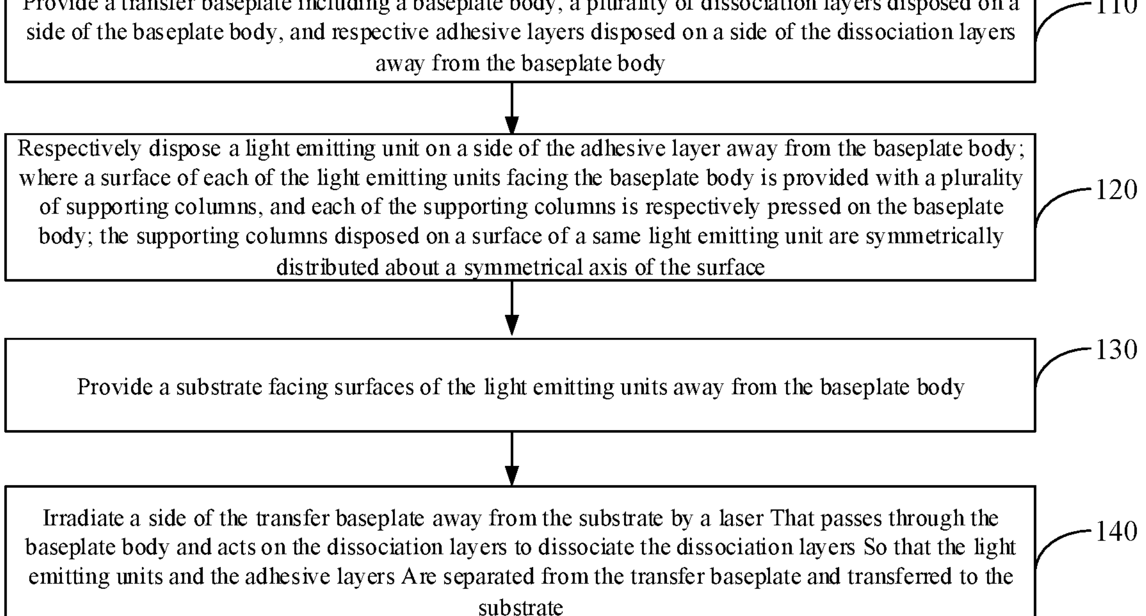
FIG. 1 illustrates a flowchart of a method for manufacturing a light emitting baseplate according to an embodiment of the present application.

Embodiments of the present application provide a method of manufacturing a light emitting baseplate. Referring to FIG. 1, the method of manufacturing a light emitting baseplate includes following steps 110 to 140.

At step 110, a transfer baseplate is provided; where the transfer baseplate includes a baseplate body, a plurality of dissociation layers disposed on a side of the baseplate body, and respective adhesive layers disposed on a side of the dissociation layers away from the baseplate body.

At step 120, a light emitting unit is respectively disposed on a side of each of the adhesive layers away from the baseplate body; where supporting columns are respectively disposed on a surface of each of the light emitting units facing the baseplate body, and each of the supporting columns is respectively pressed on the baseplate body; the supporting columns disposed on a surface of a same light emitting unit are symmetrically distributed about a symmetrical axis of the surface.

At step 130, a substrate is provided, and the substrate faces surfaces of the light emitting units away from the baseplate body.

At step 140, a side of the transfer baseplate away from the substrate is irradiated by a laser which passes through the baseplate body and acts on the dissociation layers to dissociate the dissociation layers so that the light emitting units and the adhesive layers are separated from the transfer baseplate and transferred to the substrate.

In the methods for manufacturing a light emitting baseplate provided by the embodiments of the present application, because the supporting columns are disposed on the surfaces of the light emitting units facing the baseplate body, and the supporting columns are pressed on the baseplate body after the light emitting units are disposed on the adhesive layers, the supporting columns can support the light emitting units. Since the supporting columns disposed on a surface of a same light emitting unit are symmetrically distributed on the surface of the light emitting unit facing the baseplate body, supporting force of the supporting columns on the light emitting unit is relatively evenly distributed, which can avoid tilting or shift of the light emitting unit relative to the dissociation layer due to uneven distribution of force after the light emitting unit is adhered to the transfer baseplate by the adhesive layer, thus avoiding deviation of a position of the light emitting unit relative to a predetermined bonding position after the light emitting unit is transferred to the substrate due to the tilting or shift of the light emitting unit relative to the dissociation layer. A transfer yield of the light emitting units and a yield of the light emitting baseplate can be improved.

Each step of the manufacturing method of the light emitting baseplate may be described in detail below.

At step 110, a transfer baseplate is provided. The transfer baseplate includes a baseplate body, a plurality of dissociation layers disposed on a side of the baseplate body, and respective adhesive layers disposed on a side of the dissociation layers away from the baseplate body.

Figure 2:
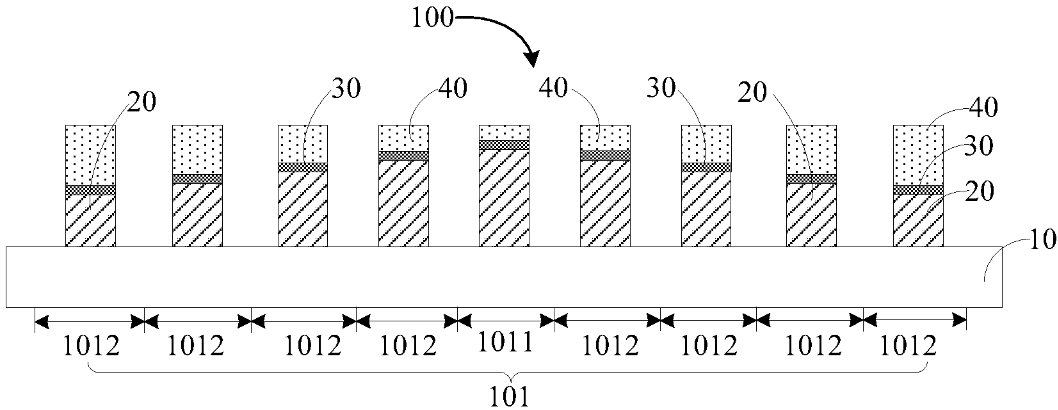
FIG. 2 illustrates a partial sectional view of a transfer baseplate according to an embodiment of the present application.
Figure 3:
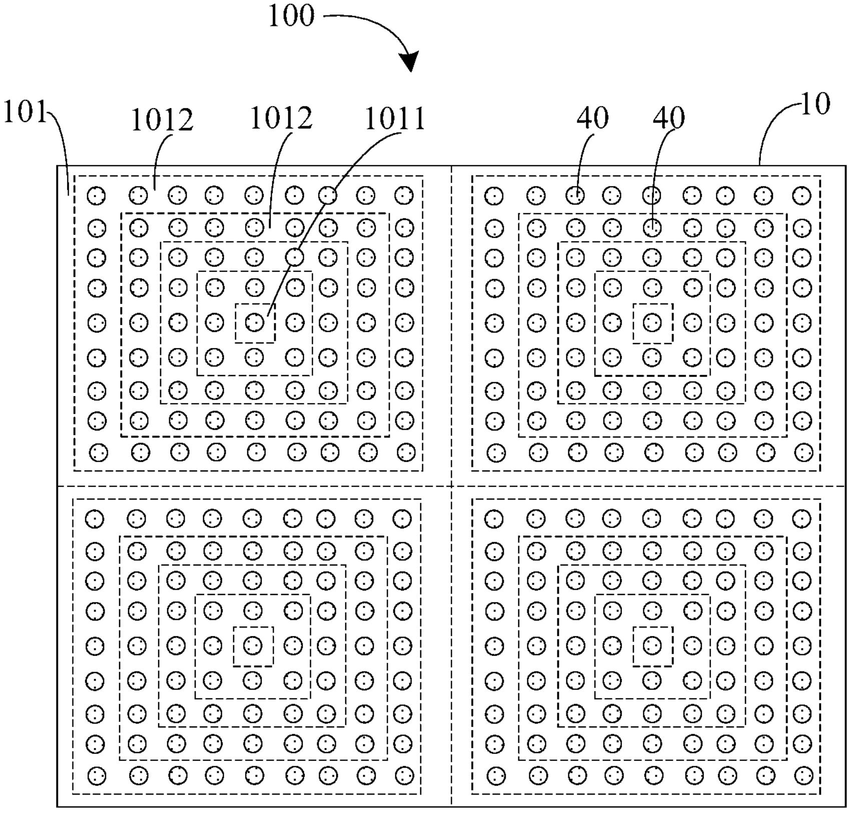
FIG. 3 illustrates a top view of a transfer baseplate according to an embodiment of the present application.

FIG. 2 and FIG. 3 are structural diagrams of a transfer baseplate 100 provided in step 110. As shown in FIGS. 2 and 3, the transfer baseplate 100 includes a baseplate body 10, a plurality of dissociation layers 30 disposed on the baseplate body 10, and respective adhesive layers 40 disposed on a side of the dissociation layers 30 away from the baseplate body 10.

In an embodiment, as shown in FIGS. 2 and 3, a surface of the baseplate body 10 includes one or more second target regions 101, and a plurality of dissociation layers 30 are disposed in a second target region 101. The transfer baseplate 100 is further provided with a plurality of bumps 20 disposed between the baseplate body 10 and the dissociation layers 30, with multiple bumps 20 in each second target region 101. Heights of the bumps 20 gradually decrease from a center to an edge of the second target region 101.

Before a laser is incident on the transfer baseplate, it passes through a field lens, which focuses the laser and controls an action area of the laser beam. The laser beam that has passed through the field lens passes through the baseplate body and acts on the dissociation layers. When the laser energy reaches energy required for dissociation of the dissociation layers, the dissociation layers dissociate. An action surface of the laser that has passed through the field lens is not a plane, but a curved surface with a certain curvature. The greater a distance between the laser and a focus of the field lens, the smaller energy of the laser. When a distance between the laser and the field lens reaches a certain distance, energy of the laser acting on the dissociation layers may be small, which may lead to a risk that the dissociation layers cannot be dissociated.

In the embodiments of the present application, the heights of the bumps 20 gradually decrease from the center to the edge of the second target region 101. When the laser focused by the field lens is incident through the baseplate body 10 to the dissociation layers 30, distance differences between the dissociation layers 30 disposed on the bumps 20 and the focus point of the field lens are small, which may avoid a case that a dissociation layer 30 on a bump 20 located at the center of the second target region 101 cannot be dissociated successfully due to a relatively large distance between the dissociation layer 30 and the focus point of the field lens, and ensure that all of the light emitting units may be transferred to the substrate and improve the yield of the manufactured light emitting baseplates.

In an embodiment, the second target region 101 includes a second central region 1011 and a plurality of second circumferential regions 1012 located around the second central region 1011, and the heights of the bumps 20 disposed in a same second circumferential region 1012 are equal. In two adjacent second circumferential regions 1012, a height of the bumps 20 in an outer second circumferential region 1012 is lower than a height of the bumps 20 in an inner second circumferential region 1012. That the heights of the bumps 20 disposed in the same second circumferential region 1012 are equal means that the heights of a plurality of bumps 20 disposed in the same second circumferential region 1012 are substantially equal. That is, the heights of the plurality of bumps 20 may be equal, or height difference in the plurality of bumps 20 may be very small.

A bump 20 may be disposed in the second central region 1011, and the second central region 1011 may be opposite to the focus point of the field lens. The heights of the bumps 20 disposed in the same second circumferential region 1012 are equal, so that the distances between a plurality of dissociation layers 30 disposed in the same second circumferential region 1012 and the focus point of the field lens are substantially equal, energy of the laser acting on the dissociation layers 30 in the same second circumferential region 1012 is substantially equal, and all the dissociation layers 30 in the same second circumferential region 1012 can be dissociated with the laser.

In some embodiments, a laser has a capability/coverage range of 10 μm, that is, on a surface of a baseplate body, when a maximum distance between a point on an edge of a second target region 101 and a center of the second target region 101 is 5 μm, the laser may dissociate all dissociation layers 30 in a second central-target region. In an exemplary embodiment, the second target region 101 may include four second circumferential regions 1012, a diameter of a circumcircle of the second central region 1011 may be 2 mm, and diameters of circumcircles of outer edges of the four second circumferential regions 1012 may be 4 mm, 6 mm, 8 mm, and 10 mm, respectively. In other embodiments, the number of second circumferential regions 1012 included in the second target region 101 may not be equal to four.

In an embodiment, height difference between the bumps 20 within any two adjacent second circumferential regions 1012 is equal. In this way, heights of bumps in different second circumferential regions 1012 change gradually, which helps to make distance difference between the dissociation layers 30 in each second circumferential region 1012 and a focus point of a field lens smaller, and further avoid a case that energy acting on a dissociation layer 30 is too small to cause dissociation. In some embodiments, height difference of bumps in adjacent second circumferential regions 1012 may be 1 μm. A maximum height of the bump in a second target region may be 10 μm. That is, a height of a bump 20 in a second central region 1011 is 10 μm. When the second target region 101 includes four second circumferential regions 1012, from a center to an edge of the second target region 101, the heights of the bumps in the second circumferential regions 1012 may be 9 μm, 8 μm, 7 μm, and 6 μm in turn.

In an embodiment, thicknesses of the dissociation layers 30 disposed on each bump 20 are approximately the same.

In an embodiment, a thickness of the dissociation layer 30 may be less than 1 mm. This configuration can prevent the thickness of the dissociation layers 30 from being so large that laser acting on the dissociation layers 30 cannot dissociate the dissociation layers 30 and thus transfer of light emitting units to the substrate is affected. In some embodiments, the thickness of each dissociation layer 30 may be about 300 nm.

In an embodiment, distances from surfaces of each adhesive layer 40 away from the baseplate body 10 to the baseplate body 10 are equal. Being equal means being approximately equal, that is, the distances between the surfaces of each adhesive layer 40 away from the baseplate body 10 and the baseplate body 10 are equal, or difference in the distances between the surfaces of each adhesive layer 40 away from the baseplate body 10 and the baseplate body 10 is very small. In this way, the distances between the light emitting units disposed in step 120 on the surface of each adhesive layer away from the baseplate body and the baseplate body are substantially equal, so when the light emitting units are transferred to the substrate, the distances between each light emitting unit and the substrate are approximately equal, which is more conducive to batch transfer of light emitting units.

In an embodiment, a thickness of the adhesive layer 40 ranges from 1 μm to 20 μm. That is, among the plurality of adhesive layers 40 of the transfer baseplate, a thickness of a thickest adhesive layer 40 may be 20 μm, and a thickness of a thinnest adhesive layer 40 may be 1 μm. Since height difference of bumps 20 in any two adjacent second circumferential regions 1012 is equal, thickness difference of the adhesive layers 40 in any two adjacent second circumferential regions 1012 is equal to the height difference of bumps in any two adjacent second circumferential regions 1012. For example, the thickness difference between two adjacent second circumferential regions 1012 is 1 μm and the height of the adhesive layer in the second central region of the second target region is 7 μm, from the center to the edge of the second target region 101, the thicknesses of the adhesive layers in the second circumferential regions 1012 are 8 μm, 9 μm, 10 μm, and 11 μm in turn.

In an embodiment, a shape of a cross section of each of the dissociation layers 30 may be an axisymmetric figure or a centrosymmetric figure. In this way, during a dissociation process of the dissociation layer 30, the distribution of forces exerted by the dissociation layer on a surface of a light emitting unit is relatively uniform, which can avoid tilting or shift of the light emitting unit, and ensure that bonding accuracy of the light emitting unit on the light emitting baseplate is relatively high. In some embodiments, the cross section of the dissociation layer 30 may be circular, rectangular or regular polygon or the like.

In an embodiment, a shape of a cross section of each of the adhesive layers 40 may be an axisymmetric figure or a centrosymmetric figure. In a dissociation process of the dissociation layer 30, the dissociation layer exerts force on the light emitting unit through the adhesive layer 40. When the cross section of the adhesive layer 40 is an axisymmetric figure or a centrosymmetric figure, the force exerted on the light emitting unit through the adhesive layer 40 by the dissociation layer 30 during the dissociation of the dissociation layer 30 may be distributed evenly, which can avoid the tilting or shift of the light emitting unit, and ensure that the bonding accuracy of the light emitting unit bonded on the light emitting baseplate is relatively high. In some embodiments, the cross section of the adhesive layer 40 may be circular, rectangular or regular polygon or the like.

In an embodiment, an edge of an orthographic projection of a bump 20 on the baseplate body 10 is located outside an edge of an orthographic projection of a corresponding dissociation layer 30 on the baseplate body 10. That is, an area of the bump 20 is larger than an area of the dissociation layer 30. When a laser acts on the dissociation layer 30, a light spot of the laser is incident to a center of a surface of the bump 20. Setting the edge of the orthographic projection of the bump 20 on the baseplate body 10 outside the edge of the orthographic projection of the corresponding dissociation layer 30 on the baseplate body 10 may avoid a situation where the dissociation layer 30 cannot be successfully dissociated due to deviation of the light spot of the laser relative to the dissociation layer 30.

In some embodiments, distances between points on the edge of the dissociation layer 30 disposed on the bump 20 and the edge of the bump may be greater than 3 μm. This configuration may effectively avoid the deviation of the light spot of the laser relative to the dissociation layer 30, and ensure a dissociation effect of the dissociation layer 30.

In an embodiment, the transfer baseplate 100 may be formed by following steps.

First, bumps are formed on a baseplate body.

In an embodiment, material of the baseplate body may be glass, and material of the bumps may be resin. A plurality of bumps with different heights may be formed by coating the baseplate body with a resin film layer and by gradient exposure of the resin film layer. In other embodiments, the baseplate body and the bumps may be integrally formed.

Then, a dissociation layer and an adhesive layer are formed in turn on a surface of each of the bumps away from the baseplate body.

In an embodiment, the dissociation layers and the adhesive layers may be formed by a spin coating process on the bumps in turn. A dissociation film layer can be obtained by spin coating a dissociation material first, and then an adhesive film layer can be obtained by spin coating an adhesive material, and then the dissociation film layer and the adhesive film layer can be patterned to obtain the dissociation layers and the adhesive layers. A thickness of the adhesive film layer obtained by spin coating the adhesive material is large, and distances between places on a surface of the adhesive film layer away from the baseplate body and the baseplate body are approximately equal. Since the distances between the places on the surface of the adhesive film layer away from the baseplate body and the baseplate body are approximately equal, among a plurality of adhesive layers obtained by patterning the adhesive film layer, the distances between surfaces of each adhesive layer 40 away from the baseplate body 10 and the baseplate body 10 are equal.

At step 120, a light emitting unit is respectively disposed on a side of each of the adhesive layers away from the baseplate body; where supporting columns are respectively disposed on a surface of each of the light emitting units facing the baseplate body, and each of the supporting columns is respectively pressed on the baseplate body; and the supporting columns disposed on a surface of a same light emitting unit are symmetrically distributed about a symmetrical axis of the surface.

Figure 4:
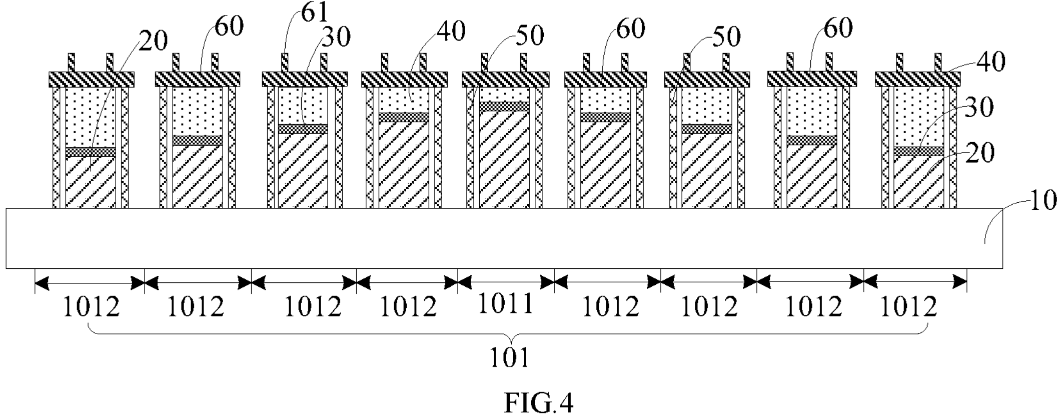
FIG. 4 illustrates a schematic structural diagram illustrating an intermediate structure in a light emitting baseplate manufacturing process according to an embodiment of the present application.

The intermediate structure shown in FIG. 4 can be obtained through this step. As shown in FIG. 4, a light emitting unit 60 is disposed on an adhesive layer 40, and an area of a surface of the light emitting unit 60 facing the baseplate body 10 is larger than an area of the adhesive layer 40. Bonding terminals 61 are disposed on surfaces of the light emitting units 60 away from the baseplate body 10. After the light emitting units 60 are transferred to the substrate, the light emitting units 60 are bonded to the substrate through the bonding terminals 61. Supporting columns 50 are disposed on surfaces of the light emitting units 60 facing the baseplate body 10.

In an embodiment, a minimum distance between a supporting column 50 and an edge of a light emitting unit 60 is greater than 3 μm. In this way, difficulty of process manufacturing caused by a small distance between the supporting column 50 and the edge of the light emitting unit 60 can be alleviated. In some embodiments, the minimum distance between the supporting column 50 and each position on the edge of the light emitting unit 60 may be 3.5 μm, 4 μm or the like.

Figure 5:
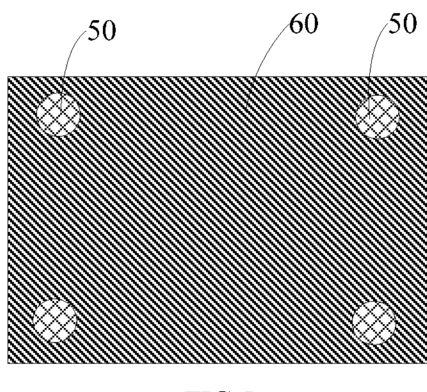
FIG. 5 illustrates a top view of a light emitting unit according to an embodiment of the present application.

In an embodiment, as shown in FIG. 5, a surface of a light emitting unit 60 away from a bonding terminal 61, which is also the surface of the light emitting unit 60 disposed with the supporting columns 50, may be rectangular, and one supporting column 50 is respectively disposed near each of four corners of the surface of the light emitting unit 60 away from the bonding terminal 61. In this way, four supporting columns 50 disposed on the surface of the light emitting unit 60 away from the bonding terminal 61 are symmetrically distributed with respect to the two symmetry axes of the surface, and supporting force exerted by the supporting columns 50 on the light emitting unit is evenly distributed.

Figure 6:
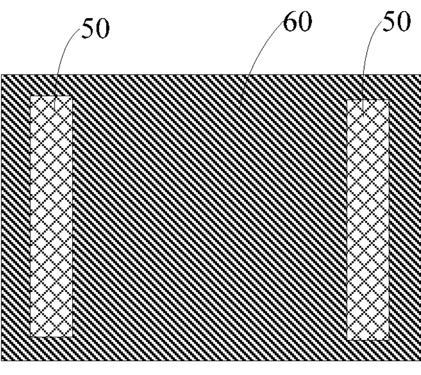
FIG. 6 illustrates a top view of a light emitting unit according to another embodiment of the present application.

In an embodiment, as shown in FIG. 6, a surface of a light emitting unit 60 away from a bonding terminal 61, which is also the surface of the light emitting unit 60 disposed with the supporting columns 50, may be rectangular, one supporting column 50 with a long strip shape is respectively disposed near each of two opposite sides of the surface of the light emitting unit 60 away from the bonding terminal 61, and the supporting columns 50 disposed near the two opposite sides of the surface are symmetrical. The two supporting columns 50 with a long strip shape disposed on the surface of the light emitting unit 60 away from the bonding terminal 61 are symmetrically distributed with respect to the two symmetry axes of the surface, and thus supporting force of the supporting columns 50 on the light emitting unit is evenly distributed. In the embodiment shown in FIG. 6, the two sides of the surface of the light emitting unit 60 away from the bonding terminal 61 near which the supporting columns 50 are disposed may be two short sides. In other embodiments, the two sides of the surface of the light emitting unit away from the bonding terminal 61 near which the supporting columns 50 are disposed may alternatively be two long sides.

In some embodiments, a distance between a supporting column 50 disposed near a short side of the surface of the light emitting unit 60 away from the bonding terminal 61 and a center of the surface is greater than or equal to one-third of a length of a long side of the surface; a distance between a supporting column 50 disposed near the long side of the surface of the light emitting unit 60 away from the bonding terminal 61 and the center of the surface is greater than or equal to one-third of a length of the short side of the surface. In this way, a case that the light emitting unit 60 is prone to tilt, which is caused by concentration of supporting force of the supporting columns 50 on the surface of the light emitting unit 60 at a center of the surface of the light emitting unit 60 due to a too small distance between the supporting columns 50 and the center of the surface of the light emitting unit 60, may be avoided. Effective support to the light emitting unit by the supporting columns 50 can be ensured to avoid tilting or shift of the light emitting unit 60.

In an embodiment, prior to the step 120 of disposing light emitting units on sides of each adhesive layer away from the baseplate body, difference between the height of the supporting column 50 and a distance from the surface of the adhesive layer 40 away from the baseplate body 10 to the baseplate body 10 ranges from 0.5 μm to 1.5 μm. After the step 120 of disposing light emitting units on sides of each adhesive layer away from the baseplate body, the supporting columns 50 are compressed. Surfaces of the supporting columns 50 away from the light emitting units 60 are pressed on the baseplate body 10. After the light emitting units are disposed on the adhesive layers, force exerted by the light emitting units on supporting structures may compress the supporting structures. By setting difference between the heights of the supporting columns 50 and the distances from the surfaces of the adhesive layers 40 away from the baseplate body 10 to the baseplate body 10 in a range of 0.5 μm to 1.5 μm, compressed heights of the supporting structures can be equal to the distances from the surfaces of the adhesive layers 40 away from the baseplate body 10 to the baseplate body 10, which may ensure a supporting effect of the supporting columns on the light emitting units, and may help avoid tilting or shift of the light emitting units relative to the adhesive layers.

In some embodiments, the material of the supporting columns 50 may be non-sticky resin material or acrylic material, and the supporting columns 50 have certain compressibility.

In an embodiment, the light emitting unit 60 may be mini LED or micro LED.

At step 130, a substrate is provided, and the substrate faces surfaces of the light emitting units away from the baseplate body.

In an embodiment, the substrate may be any suitable baseplate such as a plastic baseplate, a silicon baseplate, a ceramic baseplate, a glass baseplate, a quartz baseplate or the like. A material of the substrate is not limited in embodiments of the present application.

Figure 7:
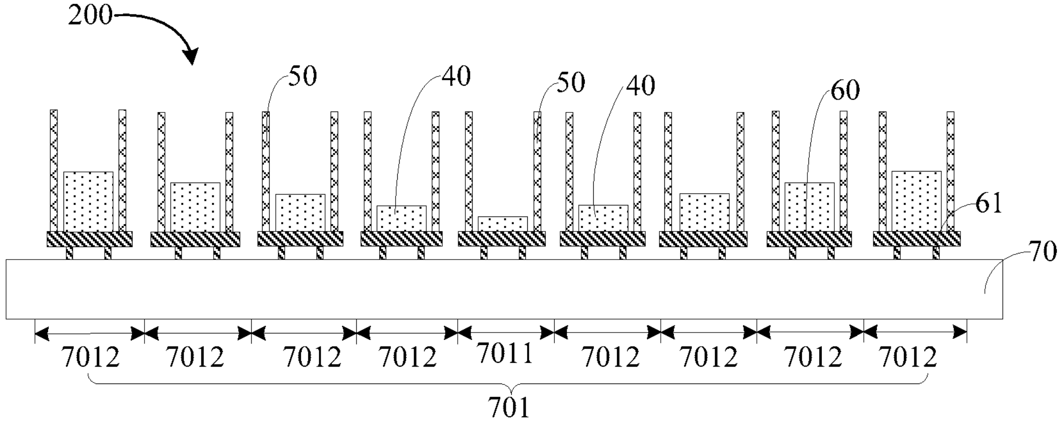
FIG. 7 illustrates a partial sectional view of a light emitting baseplate according to an embodiment of the present application.

As shown in FIG. 7, a surface of the substrate 70 includes one or more first target region 701 and each first target region 701 includes a first central region 7011 and a plurality of first circumferential regions 7012 located around the first central region 7011.

When the substrate 70 faces the baseplate body 10, the one or more second target regions 101 of the baseplate body 10 can correspond to the one or more first target regions 701 of the substrate 70 one by one; and a size of a second target region 101 is equal to that of a corresponding first target region 701. In the second target region 101 of the baseplate body 10 and the corresponding first target region 701, the size of the second central region 1011 may be equal to that of the first central region 7011, a number of the second circumferential regions 1012 may be equal to that of the first circumferential regions 7012, and the second circumferential regions 1012 may be one-to-one corresponded to the first circumferential regions 7012. A size of a second circumferential region 1012 is equal to that of a corresponding first circumferential region 7012.

At step 140, a side of the transfer baseplate away from the substrate is irradiated by a laser which passes through the baseplate body and acts on the dissociation layers to dissociate the dissociation layers so that the light emitting units and the adhesive layers are separated from the transfer baseplate and transferred to the substrate.

In an embodiment, the step of using a laser to irradiate the side of the transfer baseplate away from the substrate includes: using a laser that has passed through a field lens to irradiate the side of the transfer baseplate away from the substrate; where an area of the field lens is substantially equal to the size of the second target region. The field lens focuses the laser and controls an action area of the laser beam. By setting the area of the field lens to be substantially equal to the size of the second target region, when the laser is incident into the second target region, that the laser can act on each dissociation layer in the second target region to free all light emitting units disposed on the adhesive layers in the second target region may be ensured.

In an embodiment, an orthographic projection of the field lens on the baseplate body substantially coincides with the second target region.

In an embodiment, when using the laser to irradiate the side of the transfer baseplate away from the substrate, an edge of an orthographic projection of a dissociation layer on the baseplate body is located within an edge of an orthographic projection of a laser spot on the baseplate body. In this way, laser energy acts on the dissociation layers and dissociation yield of the dissociation layers may be ensured.

Figure 8:
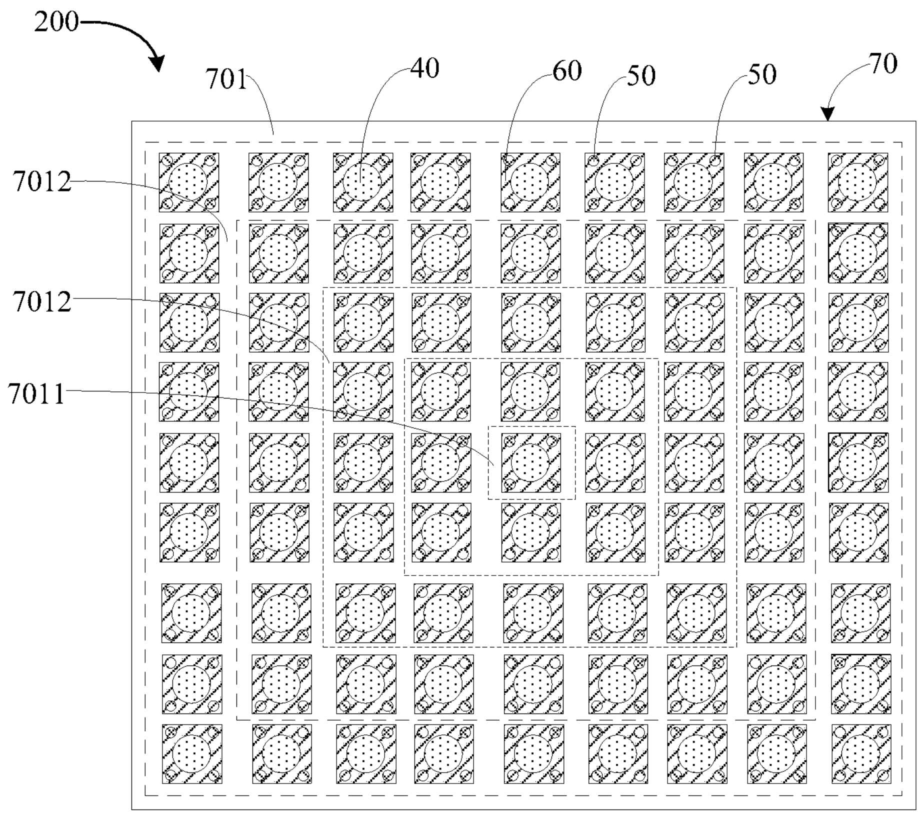
FIG. 8 illustrates a partial top view of a light emitting baseplate according to an embodiment of the present application.

In the step 140, after the dissociation layers 30 are dissociated, the light emitting units 60 and the adhesive layers 40 are both separated from the bumps, then the supporting columns 50, the adhesive layers 40 and the light emitting units 60 are transferred to the substrate 70 together. In corresponding first target region 701 and second target region 101, the adhesive layers 40 and the light emitting units 60 in the second central region 1011 are transferred to the first central region 7011, the adhesive layers 40 and the light emitting units 60 in the second circumferential regions 1012 are transferred to corresponding first circumferential regions 7012. A light emitting baseplate 200 shown in FIGS. 7 and 8 may be obtained by the step 140. As shown in FIGS. 7 and 8, the light emitting baseplate 200 includes a substrate 70, a plurality of light emitting units 60 located on a side of the substrate 70, and an adhesive layer 40 and supporting columns 50 located on a side of each of the light emitting units 60 away from the substrate 70.

In an embodiment, when heights of the adhesive layers 40 gradually increase from a center to an edge of the second target region 101 of the baseplate body 10, in a light emitting baseplate obtained by transferring the adhesive layers 40 and the light emitting units to the substrate 70, heights of the adhesive layers 40 gradually increase from a center to an edge of the first target region 701 of the light emitting baseplate 200.

In an embodiment, in two adjacent first circumferential regions 7012, a distance between a surface of an adhesive layer 40 away from the substrate 70 and the substrate 70 in an outer first circumferential region 7012 is greater than a distance between a surface of an adhesive layer 40 away from the substrate 70 and the substrate 70 in an inner first circumferential region 7012. Height difference between the adhesive layers 40 in any two adjacent first circumferential regions 7012 is equal.

Figure 9:
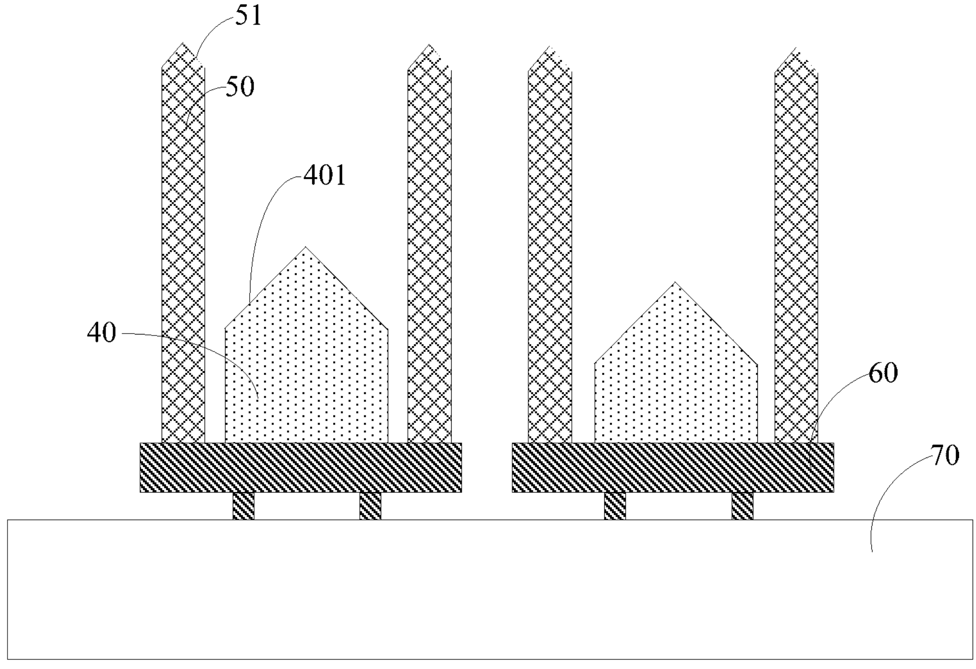
FIG. 9 illustrates a partial sectional view of a light emitting baseplate according to another embodiment of the present application.

In an embodiment, after the step 140, the method for manufacturing a light emitting baseplate further includes: forming a first inclined plane 51 on a side of a supporting column 50 away from a substrate 70 to obtain a light emitting baseplate as shown in FIG. 9, and a maximum emergence angle of light rays emitted by a light emitting unit 60 incident through the supporting column 50 to a medium between adjacent supporting columns 50 is a first included angle, an included angle between the first inclined plane 51 and the substrate 70 is a second included angle, and the second included angle is greater than or equal to the first included angle. Setting the second included angle greater than or equal to the first included angle facilitates the light emitted by the light emitting unit 60 to emit through the supporting column 50, thus improving light emitting efficiency of the light emitting unit and amount of light emitted from the light emitting baseplate.

In an embodiment, after the step 140, the method for manufacturing a light emitting baseplate further includes: forming a second inclined plane 401 on a side of an adhesive layer 40 away from a substrate 70 to obtain a light emitting baseplate as shown in FIG. 9, and a maximum emergence angle of light rays emitted by a light emitting unit 60 incident through the adhesive layer 40 to a medium between adjacent adhesive layers 40 is a third included angle, an included angle between the second inclined plane 401 and the substrate 70 is a fourth included angle, and the fourth included angle is greater than or equal to the third included angle. Setting the fourth included angle greater than or equal to the third included angle facilitates the light emitted by the light emitting unit 60 to emit through the adhesive layer 40, thus improving light emitting efficiency of the light emitting unit and amount of light emitted from the light emitting baseplate.

In an embodiment, after the step 140, the method for manufacturing a light emitting baseplate further includes: performing sealing to form a transparent material layer covering the adhesive layers 40, the supporting columns 50, the light emitting units 60, and exposed parts of the substrate 70. A surface of the transparent material layer away from the substrate may be substantially flush.

Embodiments of the present application also provide a light emitting baseplate. As shown in FIGS. 7 to 9, the light emitting baseplate includes a substrate 70, a plurality of light emitting units 60 and a plurality of supporting columns 50 disposed on the substrate 70. The supporting columns 50 are located on surfaces of the light emitting units 60 away from the substrate 70. The surface of each light emitting unit 60 away from the substrate 70 is provided with supporting columns 50, and heights of the supporting columns 50 are equal. The supporting columns 50 disposed on a surface of a same light emitting unit 60 are symmetrically distributed about a symmetrical axis of the surface.

In an embodiment, a minimum distance between a supporting column 50 and an edge of a light emitting unit 60 is greater than 3 μm.

In an embodiment, as shown in FIG. 5, a surface of a light emitting unit 60 away from the substrate 70 may be rectangular, and one supporting column 50 is respectively disposed at each of the four corners of the surface of the light emitting unit 60 away from the substrate 70.

In an embodiment, as shown in FIG. 6, a surface of a light emitting unit 60 away from the substrate 70 may be rectangular, one supporting column 50 with a long strip shape is respectively disposed near each of two opposite sides of the surface of the light emitting unit 60 away from the substrate 70, and the supporting columns 50 disposed near the two opposite sides of the surface are symmetrical.

In an embodiment, a distance from the supporting column 50 disposed near a short side of the surface of the light emitting unit 60 away from the substrate 70 to a center of the surface is greater than or equal to one-third of a length of a long side of the surface.

In an embodiment, a distance from the supporting column 50 disposed near the long side of the surface of the light emitting unit 60 away from the substrate 70 to the center of the surface is greater than or equal to one-third of a length of the short side of the surface.

In an embodiment, as shown in FIG. 9, a first inclined plane 51 is disposed on a side of a supporting column 50 away from the substrate 70, a maximum emergence angle of light rays emitted by the light emitting unit 60 incident through the supporting column 50 to a medium between adjacent supporting columns 50 is a first included angle, an included angle between the first inclined plane 51 and the substrate 70 is a second included angle, and the second included angle is greater than or equal to the first included angle.

In an embodiment, as shown in FIG. 7, the light emitting baseplate 200 also includes an adhesive layer 40 located on a side of each of the light emitting units 60 away from the substrate 70. A surface of the substrate 70 includes one or more first target regions 701. Heights of the adhesive layers 40 gradually increase from a center to an edge of the first target region 701. The adhesive layer 40 may be located at the center of the surface of the light emitting unit, and the supporting columns 50 may be located near the sides of the adhesive layer 40.

In an embodiment, the first target region 701 includes a first central region 7011 and a plurality of first circumferential regions 7012 located around the first central region 7011. Distances between surfaces of the adhesive layers 40 away from the substrate 70 that are disposed in a same first circumferential region 7012 and the substrate 70 are equal. In two adjacent first circumferential regions 7012, the distances between surfaces of the adhesive layers 40 away from the substrate 70 that are disposed in an outer first circumferential region 7012 and the substrate 70 are greater than the distances between surfaces of the adhesive layers 40 away from the substrate 70 that are disposed in an inner first circumferential region 7012 and the substrate 70.

In an embodiment, height difference between the adhesive layers 40 in any two adjacent first circumferential regions 7012 is equal.

In an embodiment, a second inclined plane 401 is disposed on a side of an adhesive layer 40 away from the substrate 70, a maximum emergence angle of light rays emitted by the light emitting unit 60 incident through the adhesive layer 40 to a medium between adjacent adhesive layers 40 is a third included angle, an included angle between the second inclined plane 401 and a surface of the substrate 70 facing the adhesive layer 40 is a fourth included angle. The fourth included angle is greater than or equal to the third included angle.

The method for manufacturing a light emitting baseplate and the light emitting baseplate provided by the embodiments of the present application belong to a same inventive concept. The description of relevant details and beneficial effects can be referred to each other, and will not be repeated here.

Embodiments of the present application further provide a display device, including a light emitting baseplate described in any one of the above embodiments.

In an embodiment, a light emitting baseplate is used as a backlight, and the display device may be a liquid crystal display device, which includes a liquid crystal display panel. The light emitting baseplate may be disposed on a non-display side of the liquid crystal display panel.

In another embodiment, the light emitting baseplate in the display device is used as a display baseplate. When the light emitting baseplate is used as a display baseplate, each of light emitting elements is used as a sub-pixel.

The display device may be any suitable display device, including but not limited to a mobile phone, a tablet, a television, a monitor, a laptop, a digital photo frame, a navigator, electric paper or other products or components with a display function.

It is to be noted that in the accompanying drawings, the dimensions of layers and regions may be exaggerated for clarity of illustration. It will be understood that when an element or a layer is referred to as being "above" or "on" another element or layer, it may be directly on the other element, or intervening layers may be present. In addition, it will be understood that when an element or a layer is referred to as being "under" or "below" another element or layer, it may be directly under the other element, or one or more intervening layers or elements may be present. In addition, it will also be understood that when a layer or an element is referred to as being "between" two layers or two elements, it may be the only layer between the two layers or two elements, or one or more intervening layers or elements may be present. Like reference numerals indicate like elements throughout.

Other implementations of the present application will be apparent to those skilled in the art from consideration of the specification and practice of the present application herein. This application is intended to cover any variation, use, or adaptive change of this application. These variations, uses, or adaptive changes follow the general principles of this application and include common general knowledge or common technical means in the art that are not disclosed in this application. The specification and the embodiments are considered as merely exemplary, and the real scope and spirit of this application are pointed out in the following claims.

It should be understood that this application is not limited to the precise structures described above and shown in the accompanying drawings, and various modifications and changes can be made without departing from the scope of this application. The scope of this application is limited only by the appended claims.

The invention claimed is:

1. A light emitting baseplate, wherein the light emitting baseplate comprises:

a substrate;

a plurality of light emitting units located on the substrate; and a plurality of supporting columns located on surfaces of the light emitting units away from the substrate;

wherein a surface of each light emitting unit of the light emitting units away from the substrate is provided with the supporting columns, respectively, heights of the supporting columns are equal; the supporting columns disposed on the surface of the light emitting unit are symmetrically distributed about a symmetrical axis of the surface and orthographic projections of the supporting columns on the substrate and an orthographic projection of the light emitting unit on the substrate overlap.

2. The light emitting baseplate of claim 1, wherein a minimum distance between the supporting columns and an edge of the light emitting unit is greater than 3 μm.

3. The light emitting baseplate of claim 1, wherein the surface of the light emitting unit away from the substrate is rectangular, and one supporting column is disposed at each of four corners of the surface of the light emitting unit away from the substrate, respectively.

4. The light emitting baseplate of claim 1, wherein the surface of the light emitting unit away from the substrate is rectangular, one supporting column with a long strip shape is disposed near each of two opposite sides of the surface of the light emitting unit away from the substrate, respectively, and the supporting columns disposed near the two opposite sides of the surface are symmetrical.

5. The light emitting baseplate of claim 4, wherein a distance from the supporting column disposed near a short side of the surface of the light emitting unit away from the substrate to a center of the surface is greater than or equal to one-third of a length of a long side of the surface, or a distance from the supporting column disposed near the long side of the surface of the light emitting unit away from the substrate to the center of the surface is greater than or equal to one-third of a length of the short side of the surface.

6. The light emitting baseplate of claim 1, wherein a first inclined plane is disposed on a side of each of the supporting columns away from the substrate, a maximum emergence angle of light rays emitted by the light emitting units incident through the supporting columns to a medium between adjacent supporting columns is a first included angle, an included angle between the first inclined plane and the substrate is a second included angle, and the second included angle is greater than or equal to the first included angle.

7. The light emitting baseplate of claim 1, further comprising adhesive layers located on a side of the light emitting units away from the substrate; a surface of the substrate comprises one or more first target regions; and heights of the adhesive layers gradually increase from a center to an edge of each of the first target regions.

8. The light emitting baseplate of claim 7, wherein the one or more first target regions each comprises a first central region and a plurality of first circumferential regions located around the first central region, distances between surfaces of the adhesive layers away from the substrate that are disposed in a same first circumferential region and the substrate are equal; in two adjacent first circumferential regions, the distances between surfaces of the adhesive layers away from the substrate that are disposed in an outer first circumferential region and the substrate are greater than the distances between surfaces of the adhesive layers away from the substrate that are disposed in an inner first circumferential region and the substrate.

9. The light emitting baseplate of claim 8, wherein a height difference between the adhesive layers in any two adjacent first circumferential regions is equal.

10. The light emitting baseplate of claim 7, wherein a second inclined plane is disposed on a side of each of the adhesive layers away from the substrate, a maximum emergence angle of light rays emitted by the light emitting units and incident through the adhesive layers to a medium between adjacent adhesive layers is a third included angle, an included angle between the second inclined plane and the surface of the substrate facing the adhesive layers is a fourth included angle, and the fourth included angle is greater than or equal to the third included angle.

11. A manufacturing method for a light emitting baseplate, wherein the manufacturing method comprises:

providing a transfer baseplate comprising a baseplate body, a plurality of dissociation layers disposed on a side of the baseplate body, and respective adhesive layers disposed on a side of the dissociation layers away from the baseplate body;

disposing respective light emitting units on a side of the adhesive layers away from the baseplate body; wherein supporting columns are respectively disposed on a surface of each of the light emitting units facing the baseplate body, and each of the supporting columns is respectively pressed on the baseplate body; the supporting columns disposed on a surface of a same light emitting unit are symmetrically distributed about a symmetrical axis of the surface;

providing a substrate facing surfaces of the light emitting units away from the baseplate body; and irradiating a side of the transfer baseplate away from the substrate by a laser which passes through the baseplate body and acts on the dissociation layers to dissociate the dissociation layers, so that the light emitting units and the adhesive layers are separated from the transfer baseplate and transferred to the substrate.

12. The manufacturing method for a light emitting baseplate of claim 11, wherein a surface of the baseplate body comprises one or more second target regions, the one or more second target regions each are provided with more than one of the dissociation layers; the transfer baseplate is further provided with bumps between the baseplate body and the dissociation layers; and heights of the bumps gradually decrease from a center to an edge of each of the second target regions.

13. The manufacturing method for a light emitting baseplate of claim 12, wherein the one or more second target regions each comprise a second central region and a plurality of second circumferential regions located around the second central region, the heights of the bumps disposed in a same second circumferential region are equal; the heights of the bumps in an outer second circumferential region are greater than the heights of the bumps in an inner second circumferential region in two adjacent second circumferential regions.

14. The manufacturing method for a light emitting baseplate of claim 12, wherein irradiating the side of the transfer baseplate away from the substrate by the laser comprises:

irradiating the side of the transfer baseplate away from the substrate by a laser that has passed through a field lens; wherein an area of the field lens is substantially equal to a size of each of the second target regions.

15. The manufacturing method for a light emitting baseplate of claim 14, wherein when irradiating the side of the transfer baseplate away from the substrate by the laser, an edge of an orthographic projection of each of the dissociation layers on the baseplate body is located within an edge of an orthographic projection of a light spot of the laser on the baseplate body.

16. The manufacturing method for a light emitting baseplate of claim 11, wherein distances between surfaces of the adhesive layers away from the baseplate body and the baseplate body are equal.

17. The manufacturing method for a light emitting baseplate of claim 11, wherein a shape of a cross section of each of the dissociation layers is an axisymmetric figure or a centrosymmetric figure.

18. The manufacturing method for a light emitting baseplate of claim 11, wherein prior to disposing the respective light emitting units on the side of the adhesive layers away from the baseplate body, a difference between a height of the supporting columns and a distance from surfaces of the adhesive layers away from the baseplate body to the baseplate body ranges from 0.5 μm to 1.5 μm;

after disposing the respective light emitting units on the side of the adhesive layers away from the baseplate body, the supporting columns are compressed, and surfaces of the supporting columns away from the light emitting units are pressed on the baseplate body.

19. The manufacturing method for a light emitting baseplate of claim 11, wherein a thickness of each of the dissociation layers is less than 1 mm.

20. A display device, wherein the display device comprises a light emitting baseplate comprising:

a substrate;

a plurality of light emitting units located on the substrate; and a plurality of supporting columns located on surfaces of the light emitting units away from the substrate;

wherein a surface of each light emitting unit of the light emitting units away from the substrate is provided with the supporting columns, respectively, heights of the supporting columns are equal; the supporting columns disposed on the surface of the light emitting unit are symmetrically distributed about a symmetrical axis of the surface and orthographic projections of the supporting columns on the substrate and an orthographic projection of the light emitting unit on the substrate overlap.

* * * * *